(12) United States Patent
Kim

(10) Patent No.: US 7,994,414 B2
(45) Date of Patent: Aug. 9, 2011

(54) SEMICONDUCTOR DEVICE

(75) Inventor: Myung Soo Kim, Mansan-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 275 days.

(21) Appl. No.: 12/264,285

(22) Filed: Nov. 4, 2008

(65) Prior Publication Data
US 2009/0159986 A1 Jun. 25, 2009

(30) Foreign Application Priority Data
Dec. 21, 2007 (KR) .................. 10-2007-0135459

(51) Int. Cl.
*H01L 35/00* (2006.01)
(52) U.S. Cl. ................... 136/203; 136/205; 136/207
(58) Field of Classification Search .......... 136/200, 136/203, 205, 207, 201
See application file for complete search history.

(56) References Cited

U.S. PATENT DOCUMENTS
4,571,608 A * 2/1986 Johnson .............. 136/207

FOREIGN PATENT DOCUMENTS
JP P1995-0034871 12/1995
KR 10-2006-0037161 A 5/2006

\* cited by examiner

*Primary Examiner* — Michael B Shingleton
(74) *Attorney, Agent, or Firm* — Saliwanchik, Lloyd & Eisenschenk

(57) ABSTRACT

A semiconductor device is disclosed that can operate utilizing thermoelectric concepts. According to an embodiment, the semiconductor device can comprise: a source/drain conductor formed of a line of metal material on a substrate; a first gate conductor formed of a second line of metal material; and a second gate conductor formed of a third line of metal material, wherein the first gate conductor is disposed adjacent a first portion of the source/drain conductor at one end of the source/drain conductor and the second gate conductor is disposed spaced apart from the first gate conductor and adjacent a second portion of the source/drain conductor at the other end of the source/drain conductor. By applying current to the first gate conductor and the second gate conductor, current can be supplied from the one end of the source/drain conductor to the other end of the source/drain conductor.

13 Claims, 3 Drawing Sheets

US 7,994,414 B2

SEMICONDUCTOR DEVICE

CROSS-REFERENCE TO RELATED APPLICATION

The present application claims the benefit under 35 U.S.C. §119 of Korean Patent Application No. 10-2007-0135459, filed Dec. 21, 2007, which is hereby incorporated by reference in its entirety.

BACKGROUND

As the high integration of a semiconductor device progresses, a size of the gate/source/drain electrodes of a MOS transistor is reduced, resulting in a reduction in channel length. When the channel length is reduced, short channel effects (SCE) and reverse short channel effects (RSCE) are generated so that it is very difficult to control the threshold voltage of the transistor.

Also, since the driving voltage is relatively high over the size of the high integrated semiconductor device, electrons implanted from the source are severely accelerated due to the potential gradient state of the drain, and hot carriers are generated at the vicinity of the drain. A lightly doped drain (LDD) has been introduced in the art to improve the structural vulnerability of the semiconductor device.

FIG. 1 is a cross-sectional view showing a semiconductor device having a LDD structure in accordance with the related art.

Referring to FIG. 1, an active region of a substrate 10 is defined by a device isolating layer, and a gate electrode 13 of a polysilicon material and a gate insulating film 12 are patterned.

Then, the active regions at both sides of the gate electrode 13 are implanted with ions to form an LDD region 14. A sidewall spacer 18 of a silicon dioxide ($SiO_2$) material is formed at sides of the gate electrode 13.

The sidewall spacers 18 can be formed with spacers 15 of a silicon nitride (SiN) material, wherein the sidewall spacer 18 functions a role of mitigating interlayer stress and improving adhesion between the spacer 15 and the gate electrode 13.

Finally, the active regions at both sides of the spacer 15 can be implanted with ions to form a source region 16 and a drain region 17.

When forming the spacer 15 and sidewall spacer 18, deposition, etching, and cleaning processes are performed, resulting in a complicated procedure and increased manufacturing time and cost.

Also, the deposition process for forming the spacer 15 is performed at a high temperature for a long time so that the distribution of the ions implanted into the LDD region 14 occurs, which may degrade the characteristics of the device.

That is, when forming the LDD region 14, the ions, such as B and BF, are implanted and are diffused toward the edge of the channel region by the heat treatment process when forming the spacer 15.

Therefore, the LDD region 14 is extended into the semiconductor substrate below the edge of the gate electrode 13. If the overlap of the LDD region 14 and the gate electrode 13 occurs, the overlap capacitance of the gate-drain is increased and the RC delay is increased so that the electrical characteristics of the semiconductor device, including operating speed, are degraded.

Since the semiconductor device includes the implant layers, such as the source region, the drain region, and the LDD region, there is a limitation for minimizing the size of the semiconductor device. In addition, there are problems in several processes, and there is a limitation for improving operation reliability.

BRIEF SUMMARY

Embodiments of the present invention provide a semiconductor device capable of simplifying a process and implementing high integration without utilizing implant layers.

According to embodiments of the present invention, a semiconductor device is provided that utilizes thermoelectric properties to perform device operations.

A semiconductor device according to an embodiment can comprise: a source/drain conductor formed of a line of metal material on a substrate; a first gate conductor formed of a second line of metal material; and a second gate conductor formed of a third line of metal material, wherein the first gate conductor is disposed adjacent a first portion of the source/drain conductor at one end of the source/drain conductor and the second gate conductor is disposed spaced apart from the first gate conductor and adjacent a second portion of the source/drain conductor at the other end of the source/drain conductor.

DETAILED DESCRIPTION

Embodiments of a semiconductor device will be described with reference to the accompanying drawings.

Figure 1:
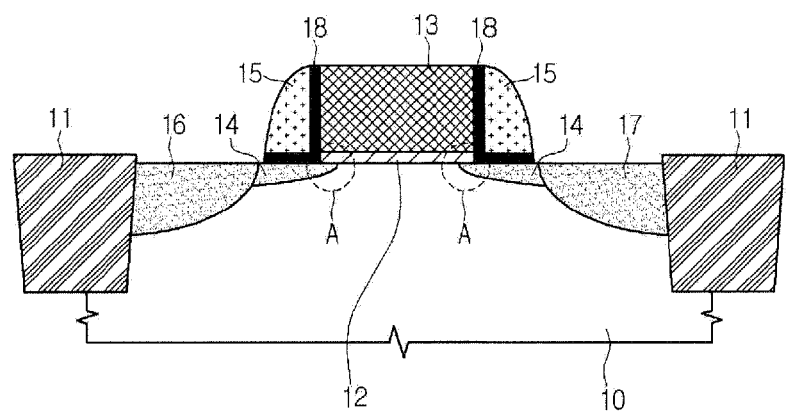
FIG. 1 is a cross-sectional view showing a semiconductor device having an LDD structure in accordance with a related art.
Figure 2:
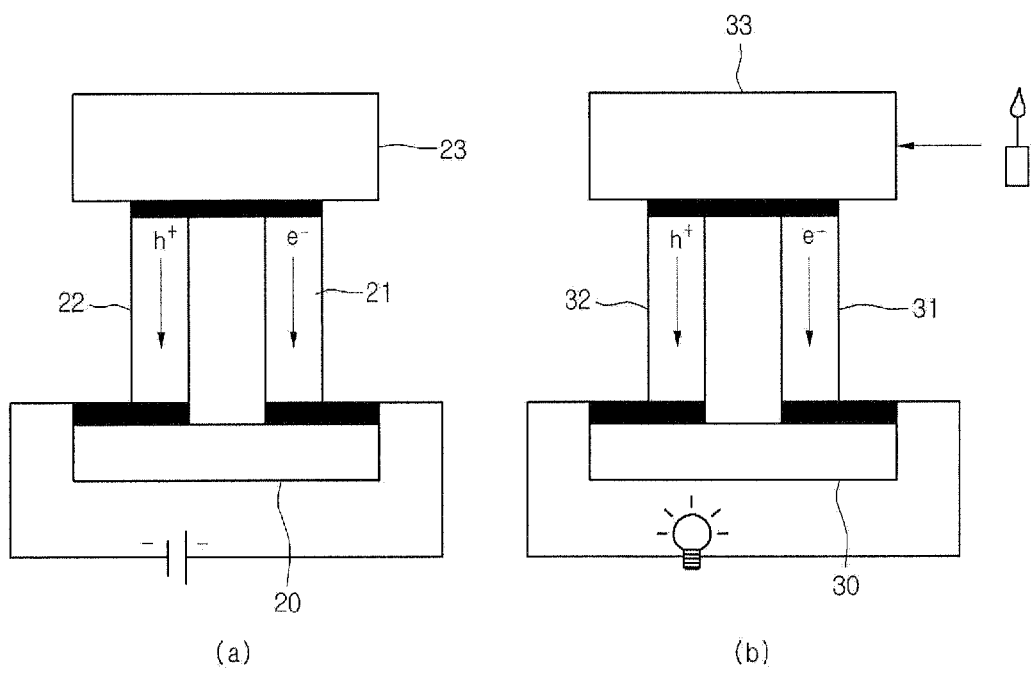
FIG. 2 is a view showing a structure of a thermoelectric device for explaining an operation principle of a semiconductor device according to an embodiment of the present invention.

FIG. 2 is a view showing a structure of a thermoelectric device for explaining an operation principle of a semiconductor device according to embodiments of the present invention.

According to embodiments, the subject semiconductor device can operate under the principles of the thermoelectric effect, which includes a Seebeck effect and Peltier effect. Accordingly, a semiconductor device in accordance with an embodiment of the present invention utilizes the mutual conversion of a thermal phenomenon and an electrical phenomenon through an energy direct conversion scheme.

The Seebeck effect relates to the generation of an electric field inside metal when a temperature difference is generated at both sides of a metal rod. Average speed of electrons at a higher temperature side is faster than that of electrons at a lower temperature side so that more electron flux moves from the higher temperature side to the lower temperature side. Consequently, electrons are accumulated at the lower temperature side to generate electric field, resulting in a lower potential at the lower temperature side. Consequently, electrons are accumulated at the lower temperature side to generate electric field, resulting in a lower potential at the lower temperature side.

The Peltier effect, which is a physical phenomenon opposite to the Seebeck effect, relates to the derivation of the temperature difference by a difference in current supplied to other regions of the metal rod.

FIG. 2(a) and FIG. 2(b) illustrate the operating principles for embodiments of the subject semiconductor device. The device shown in FIG. 2 includes a first metal body 20 (30), a second metal body 23 (33), a first connector 22 (32) connecting one side end of the first metal body 20 (30) to the second metal body 23 (33), and a second connector 21 (31) connecting the other side end of the first metal body 20 (30) to the second metal body 23 (33).

Often, in thermoelectric devices, the first connectors 22, 32 are a p-type conductor and the second connectors 21, 31 are an n-type conductor.

Referring first to FIG. 2(a), when current is supplied to the first metal body 20, positive charge carriers are moved through the first connector 22 and negative charge carriers are moved through the second connector 21 so that current is circulated between the first metal body 20 and the second body 23.

Through this operation, the moved charges transfer heat from the second metal body 23 to the first metal body 20 so that the second metal body 23 may be cooled.

In other words, current is applied to the first metal body 20 so that the first metal body 20 can function as a heat sink.

The device illustrated by FIG. 2(a) uses a thermoelectric cooling based on the Peltier phenomenon.

Referring to FIG. 2(b), when heat is supplied to the second metal body 33, the second metal body 33 functions as a heat source and the first metal body functions as the heat sink.

Therefore, the positive charge carriers are moved through the first connector 32 and the negative charge carriers are moved through the second connector 31 so that current is circulated between the first metal body 30 and the second metal body 33.

With the circulation of current, electromotive force may be generated at the second metal body 33 and current may be supplied to a circuit connected to the second metal body 33.

The device illustrated by FIG. 2(b) uses a principle of thermoelectric power generation.

Accordingly, a semiconductor device can be provided that uses the above described principles of the thermoelectric cooling and the thermoelectric power generation.

Figure 3:
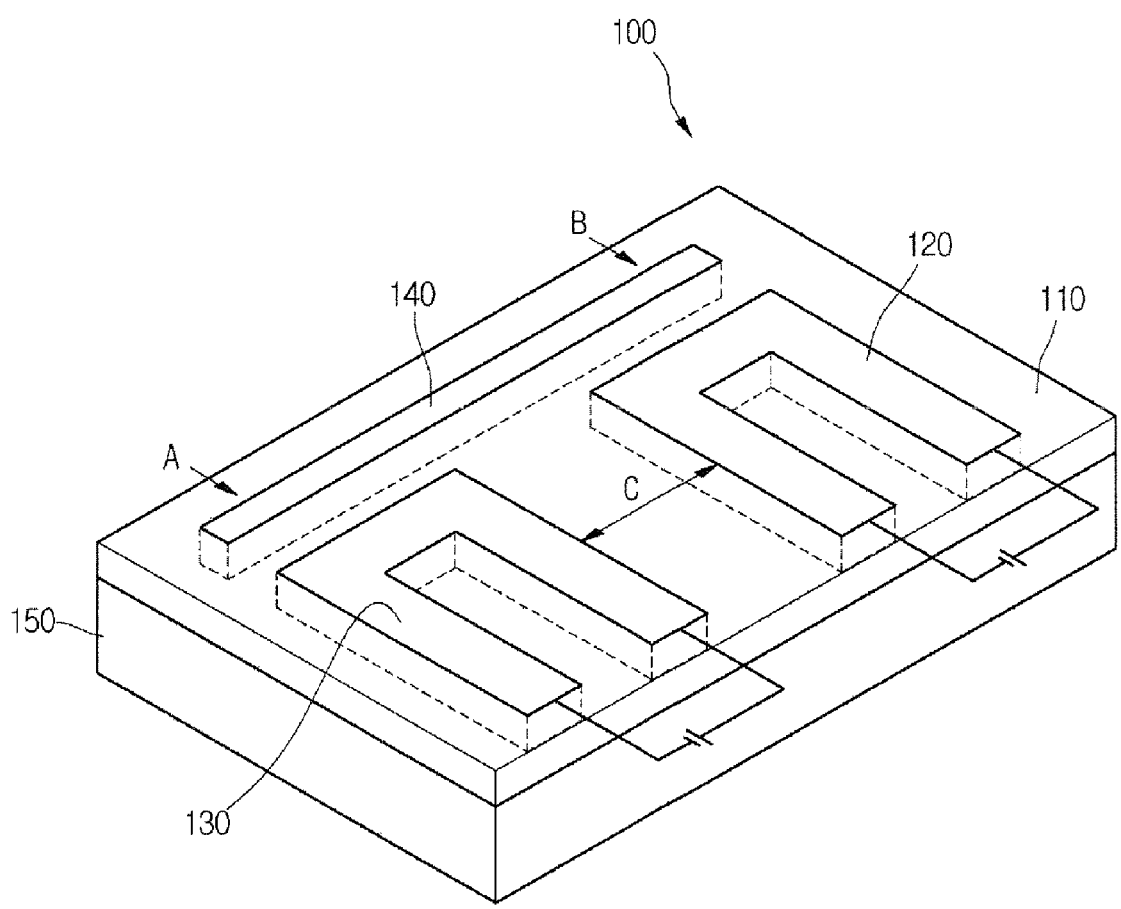
FIG. 3 is a perspective view showing a form of a semiconductor device according to a first embodiment of the present invention.

FIG. 3 is a perspective view showing a form of a semiconductor device 100 according to a first embodiment.

Referring to FIG. 3, the semiconductor device 100 can include a substrate 150, an insulating layer 110, a first gate conductor 130, a second gate conductor 120, and a source/drain conductor 140.

In an embodiment, the semiconductor substrate 150 can be a single crystal silicon substrate. The insulating layer 110 can be formed on the semiconductor substrate 150, and the first gate conductor 130, the second gate conductor 120, and the source/drain conductor 140 can be formed on the insulating layer 110.

The source/drain conductor 140, the first gate conductor 130, and the second gate conductor 120 can be configured in a line form of a metal material.

According to embodiments, the first gate conductor 130 can be disposed at one side end (A) of the source/drain conductor 140, and the second gate conductor 120 can be disposed at another side end (B) of the source/drain conductor 140.

In one embodiment, the first gate conductor 130 and the second gate conductor 120 can be formed in an "nn" structure as a bent line form.

By using the bent line form, the area of the semiconductor device 100 can be minimized.

In certain embodiments, the first gate conductor 130 and the second gate conductor 120 can be formed of a material with different temperature constants and/or at different sizes. For example, the overall length, thickness or width of the line may be formed differently.

In a specific embodiment, the source/drain conductor 140 can be formed in a straight line of a metal material. The first gate conductor 130 and the second gate conductor 120 can be arranged in parallel and spaced apart from each other by a distance C. The parallelly arranged first and second gate conductors 130 and 120 can be disposed a predetermined interval from the source/drain conductor 140. Accordingly, the source/drain conductor 140, the first gate conductor 130 and the second gate conductor 120 can be arranged along the same horizontal plane.

The first gate conductor 130 and the second gate conductor 120 can function as a gate electrode. The portion A of the source/drain conductor 140 near the first gate conductor 130 can function as a source electrode, and the portion B of the source/drain conductor 140 near the second gate conductor 120 can function as a drain electrode.

In one embodiment, the first gate conductor 130, the second gate conductor 120, and the source/drain conductor 140 are formed of the same material. In another embodiment, at least one conductor can be formed of different materials According to an embodiment, the first gate conductor 130, the second gate conductor 120, and the source/drain conductor 140, can be formed on the insulating layer 110 by any suitable process. For example, the insulating layer 110 can be formed on the substrate 150 and a photolithography process can be performed to define the conductor regions. Then, an etching process and a conductor burying process can be performed, making it possible to form the first gate conductor 130, the second gate conductor 120, and the source/drain conductors 140.

In operation, current can be supplied to the first gate conductor 130 and the second gate conductor 120. The same current, or different current can be applied. A single circuit can be used to supply the current to the first gate conductor 130 and the second gate conductor 120. In another embodiment, different circuits can be used to separately supply the current to the first gate conductor 130 and the second gate conductor 120.

When current is applied to the first gate conductor 130 and the second gate conductor 120, the first gate conductor 130 and the second gate conductor 120 are supplied with thermal electron pairs and function as the heat source (e.g., second metal body 23 of FIG. 2(a)) by the principle of the thermoelectric cooling.

This occurs through the principle described with reference to FIG. 2(a). That is, the application of current affects the temperature of the first and second gate conductors 130 and 120.

At this time, the different thermoelectric effects can be achieved by one or more of the following factors: 1) the first gate conductor 130 and the second gate conductor 120 may be formed of a material with different temperature constants; 2) the sizes of the first gate conductor 130 and the second gate conductor 120 may be different; 3) the first gate conductor 130 and the second gate conductor 120 can be supplied with different current; and 4) the interval between the gate conductors 120, 130 and the source/drain conductors 140 may be adjusted differently.

Therefore, a temperature difference can occur between the portion A and the portion B of the source/drain conductor 140. Accordingly, current can be supplied from, for example, the portion A to the portion B by the principle of the thermal power generation as in the description with reference to FIG. 2(b).

Herein, in order to supply current from the portion A to the portion B of the source/drain conductor 140, the temperature of the portion A is made to be higher than that of the portion B. In one embodiment, to make the temperature of the portion A high, the size of the first gate conductor 130 can be larger than the size of the second gate conductor B. In another embodiment, the first gate conductor 130 can be applied with a stronger current than that applied the second gate conductor B. In yet another embodiment, the temperature constant of the material for the first gate conductor 130 can be larger than that for the second gate conductor 130. In further embodiments, combinations of such factors can be utilized.

Therefore, to operate the subject semiconductor device, current of the source/drain conductor 140 can be controlled by applying current to the first gate conductor 130 and the second gate conductor 120.

Accordingly, the semiconductor device according to an embodiment can implement a source and drain through a single line-type electrode without forming a separate implant layer as required in the related art.

Hereinafter, a semiconductor device according to a second embodiment will be described with reference to the accompanying drawings.

Figure 4:
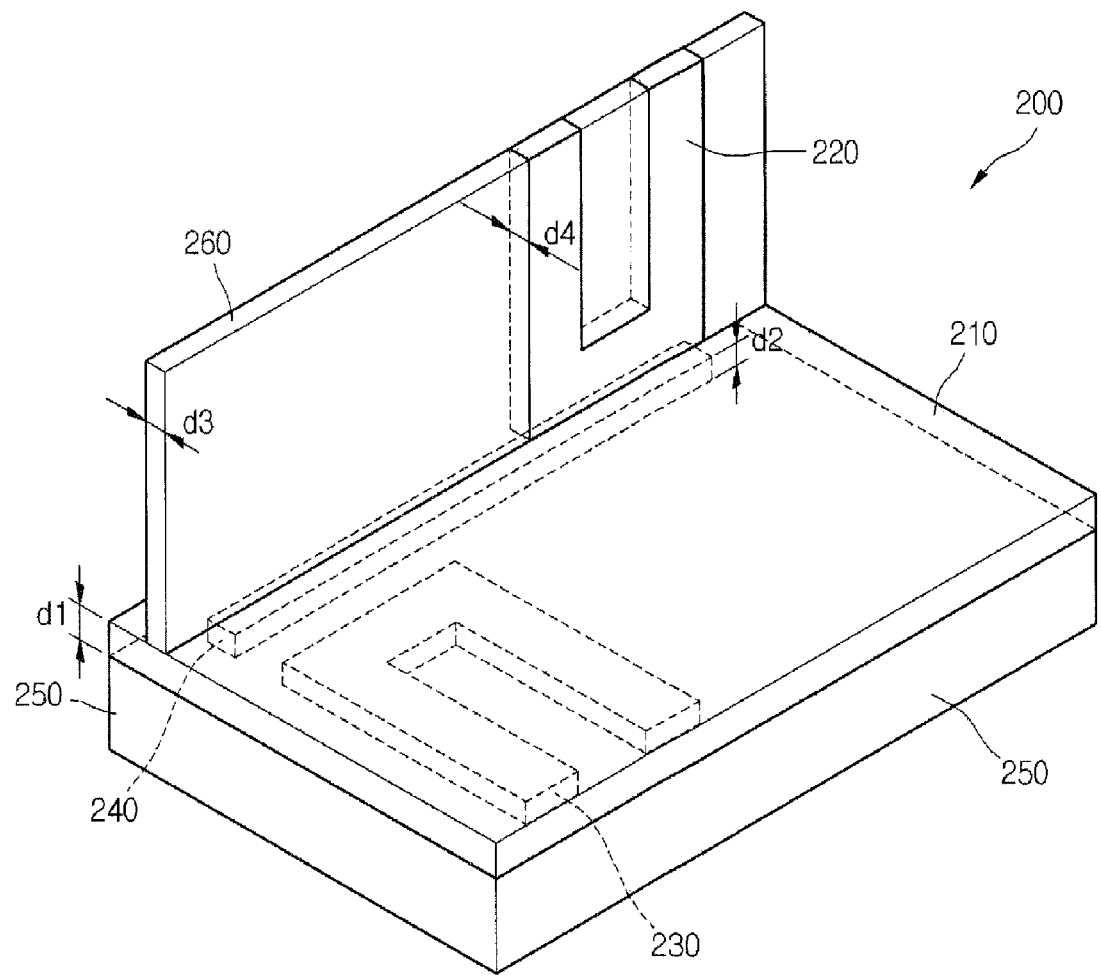
FIG. 4 is a perspective view showing a form of a semiconductor device according to a second embodiment of the present invention.

FIG. 4 is a perspective view showing a form of a semiconductor device 200 according to a second embodiment.

Referring to FIG. 4, the semiconductor device 200 according to the second embodiment includes a source/drain conductor 240, a first gate conductor 230, a second gate conductor 220, a substrate 250, a first insulating layer 210, and a second insulating layer 260.

The principles of operation for the semiconductor device according to the second embodiment utilizing the thermoelectric power generation and the thermoelectric cooling are the same as described with respect to the first embodiment. Accordingly, repeated description thereof will therefore be omitted.

The semiconductor device 200 according to the second embodiment can have the same operation principle and configuration as the first embodiment. However, for the second embodiment, the first gate conductor 230 can be formed on a first insulating layer 210 while the second gate conductor 220 is formed on a second insulating layer 260. Further, as shown on FIG. 4, the first gate conductor 230 and the second gate conductor 220 can be orthogonally arranged.

According to an embodiment, the first gate conductor 230 and the second gate conductor can be on the insulating layers having different thermal transfer constants in consideration of the thermal transfer of the insulating layers 210, 260.

Therefore, with the semiconductor device 200 according to the second embodiment, the current of the source/drain conductor 240 can be more precisely controlled by the use of the different insulating layers and the associated conditions in addition to the operation conditions of the gate conductors 120, 130 described in the first embodiment According to a specific embodiment, the thickness d1 of the first insulating layer 210 can be the same as a sum of the thickness d2 of the source/drain conductor 240 and a distance between the source/drain conductor 240 and the first gate conductor 230. As such, the source/drain conductor 240 may be covered by the first insulating layer 210 to a thickness similar to that of the distance between the source/drain conductor 240 and the first gate conductor 230.

A thickness (width) d3 of the second insulating layer 260 can be the same or larger than a thickness (width) d4 of the second gate conductor 220.

The second insulating layer 260 can be formed to cover the overall surface of the first insulating layer 210.

In certain embodiments, one or both of the insulating layers 210, 260 can be formed of a conductor material. In such embodiments, it is preferable that they have very large resistance to perform a role of an insulator. For example, the insulating layers can be formed having a thickness of about 20 nm. In certain embodiments, the thickness can be between about 10 nm to about 20 nm.

According to embodiments, a semiconductor device with new concept operated by the entirely different principle and structure from the related art can be manufactured.

Also, with the embodiment, the semiconductor device does not require an implant layer, making it possible to largely reduce the size of the semiconductor device and achieve high integration of the semiconductor device.

Also, the embodiment can simplify the process of fabricating the semiconductor device and inhibit the performance deterioration of the semiconductor device by the thermal process and the implant layer structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
a source/drain conductor formed of a line of metal material on a substrate;
a first gate conductor formed of a second line of metal material, wherein the first gate conductor is disposed adjacent a first portion of the source/drain conductor at one end of the source/drain conductor; and
a second gate conductor formed of a third line of metal material, wherein the second gate conductor is disposed adjacent a second portion of the source/drain conductor at the other end of the source/drain conductor,
wherein the first gate conductor and the second gate conductor are supplied with a same current from a single circuit, or supplied each with a different current from different circuits, and
wherein the semiconductor device satisfies at least one condition of the group consisting of:
(a) the first gate conductor d the second gate conductor are formed of materials with different temperature constants such that the first gate conductor has a different temperature constant than the second gate conductor,
(b) the first gate conductor and the second gate conductor are formed having different sizes, and
(c) the first gate conductor and the second gate conductor are formed spaced apart from the source/drain conductor by different intervals.

2. The semiconductor device according to claim 1, wherein the first gate conductor and the second gate conductor are disposed spaced apart from each other along a same side of the source/drain conductor.

3. The semiconductor device according to claim 1, wherein the first gate conductor and the second gate conductor are arranged orthogonally about the source/drain conductor.

4. The semiconductor device according to claim 3, wherein the first gate conductor is disposed on a same horizontal plane as the source/drain conductor, and wherein the second gate conductor is disposed on a same vertical plane as the source/drain conductor.

5. The semiconductor device according to claim 4, wherein the second gate conductor is spaced apart from a top surface of the source/drain conductor by approximately the same distance as the first gate conductor is spaced apart from a side surface of the source/drain conductor.

6. The semiconductor device according to claim 4, further comprising a first insulating layer upon which the first gate conductor and the source/drain conductor are formed; and a second insulating layer on the first gate conductor and the source/drain conductor, the second gate conductor being formed in the second insulating layer.

7. The semiconductor device according to claim 6, wherein the first insulating layer and the second insulating layer comprise different material.

8. The semiconductor device according to claim 6, wherein at least one of the first insulating layer and the second insulating layer comprises material with a thermal transfer constant.

9. The semiconductor device according to claim 6, wherein a thickness of the second insulating layer is equal to or larger than a thickness of the second gate conductor.

10. The semiconductor device according to claim I, wherein the source/drain conductor is arranged as a straight line and at least one of the first gate conductor and the second gate conductor is arranged as a bent line in an "n" shape.

11. The semiconductor device according to claim 1, wherein the source/drain conductor, the first gate conductor, and the second gate conductor are arranged in parallel on a single insulating layer.

12. The semiconductor device according to claim 11, wherein the single insulating layer comprises material with a thermal transfer constant.

13. The semiconductor device according to claim 11, wherein the single insulating layer is formed of a conductor having a thickness of between about 10 nm to about 20 nm.

* * * * *